(12) United States Patent
Kitahara

(10) Patent No.: US 7,282,780 B2
(45) Date of Patent: Oct. 16, 2007

(54) SEMICONDUCTOR DEVICE

(75) Inventor: Akinao Kitahara, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/891,372

(22) Filed: Jul. 14, 2004

(65) Prior Publication Data

US 2005/0012178 A1    Jan. 20, 2005

(30) Foreign Application Priority Data

Jul. 17, 2003  (JP)  ............... 2003-276021

(51) Int. Cl.
*H01L 29/92* (2006.01)
(52) U.S. Cl. ..................... 257/532; 257/296
(58) Field of Classification Search ................ 257/367, 257/387, 389, 401, 407, 412, 183.1, 184, 257/31.075
See application file for complete search history.

(56) References Cited

U.S. PATENT DOCUMENTS 5,576,233 A * 11/1996 Hutter et al. ............... 438/265
6,534,364 B1 * 3/2003 Erdeljac et al. ............. 438/264
6,825,543 B2 * 11/2004 Shimotsusa et al. ........ 257/491
2002/0167047 A1 * 11/2002 Yasuhara et al. ........... 257/341

OTHER PUBLICATIONS

Patent Abstracts of Japan, Publication No. 2000-243979, Date of Publication Sep. 8, 2000, Title: "Semiconductor Device and Manufacture Thereof".

* cited by examiner

*Primary Examiner*—Jerome Jackson
(74) *Attorney, Agent, or Firm*—Occhiuti Rohlicek & Tsao LLP

(57) ABSTRACT

A capacitor having low voltage dependency and high pn junction diode reverse breakdown voltage. A first n-well is formed in the surface of a p-type silicon substrate. A second n-well is superimposed and formed in the first n-well. A gate electrode is formed along the entire surface of the gate insulation film and part of the field insulation film. A p+ type diffusion layer having a high p-type impurity concentration is formed on the surface of the second n-well. The edge of the p+ diffusion layer is spaced from the boundary between the gate insulation film and the field insulation film at which an electric field concentrates.

7 Claims, 4 Drawing Sheets

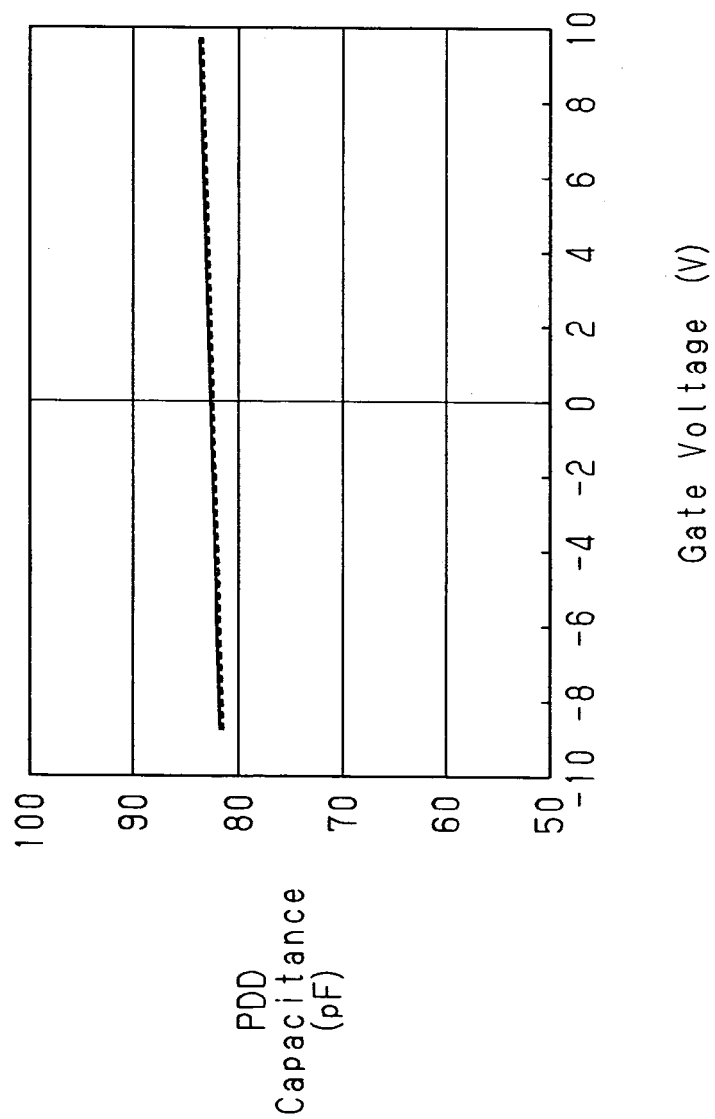

SEMICONDUCTOR DEVICE

CROSS-REFERENCES TO RELATED APPLICATIONS

This application is based upon and claims the benefit of priority from prior Japanese Patent Application No. 2003-276021 filed on Jul. 17, 2003, the entire contents of which are incorporated herein by reference.

BACKGROUND OF THE INVENTION

The present invention relates to a semiconductor device, and more particularly, to a capacitor having a reduced voltage dependency.

A driver IC for a CCD or an organic EL display device requires a voltage boosting power supply. Thus, such a driver IC incorporates a voltage boosting power supply circuit such as a DC-DC converter. A capacitor for phase compensation is used in the DC-DC converter. Due to circuitry reasons, the capacitor must have small voltage dependency.

Referring to FIG. 1, a semiconductor device including a prior art capacitor has a first n-well 51 formed in the surface of a p-type silicon substrate 50. A second n-well 52 is formed in the first n-well 51. A gate insulation film 53 and a field insulation film 54, which is adjacent to and surrounds the gate insulation film 53, are formed on the second n-well 52.

A gate electrode 56, which is a conductive body made of a material such as metal or polysilicon, contacts the upper surface of the gate insulation film 53 and part of the upper surface of the field insulation film 54. A p+ type diffusion layer 55 (PDD layer) having a relatively high p-type impurity concentration is formed in the surface of the second n-well 52. The upper surface of the p+ type diffusion layer 55 contacts the gate insulation film 53 and is arranged in alignment with an edge of the field insulation film 54 (i.e., boundary between the gate insulation film 53 and the field insulation film 54).

The gate electrode 56, the gate insulation film 53, and the p+ type insulation layer 55 form a capacitor. The gate electrode 56 and the p+ type diffusion layer 55 function as opposing capacitor electrodes. The gate insulation film 53, which is located between the gate electrode 56 and the p+ type diffusion layer 55, functions as a capacitor insulation film. The p-type impurity concentration of the p+ type diffusion layer 55 may be increased to reduce the voltage dependency (e.g., gate voltage dependency) of the capacitor.

Japanese Laid-Open Patent Publication No. 2000-243979 describes an example of a prior art capacitor.

In a voltage boosting circuit of a DC-DC converter or the like that employs the capacitor of FIG. 1, a high reverse bias voltage (e.g., 12.5 V) is applied to the pn junction between the p+ diffusion layer 55 and the second n-well 52 when the circuit is functioning. When such a reverse bias voltage is applied to the prior art capacitor, which has an insufficient pn junction diode reverse breakdown voltage, an avalanche breakdown may occur at the pn junction. In such a case, the capacitor would not function properly.

SUMMARY OF THE INVENTION

One aspect of the present invention is a semiconductor device provided with a semiconductor substrate having a first type of conductivity and including a surface. A first well having a second type of conductivity is formed in the surface of the semiconductor substrate. A second well having the second type of conductivity is formed in the first well and includes a surface. A first diffusion layer having the first type of conductivity and including an edge is formed on the surface of the second well. A capacitor insulation film is formed on the first diffusion layer. A field insulation film surrounds the capacitor insulation film. The field insulation film includes an edge adjacent to the capacitor insulation film. The edge of the field insulation film is spaced from the edge of the first diffusion layer. An electrode is formed on the capacitor insulation film.

Another aspect of the present invention is a semiconductor device provided with a semiconductor substrate having a first type of conductivity and including a surface. A first well having a second type of conductivity is formed in the surface of the semiconductor substrate. A second well having the first type of conductivity is formed in the first well and includes a surface. A diffusion layer having the first type of conductivity is formed on the surface of the second well. A capacitor insulation film is formed on the diffusion layer. A field insulation film is formed adjacent to and surrounding the capacitor insulation film. An electrode is formed on the capacitor insulation film.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 6 is a graph showing the gate voltage dependency of the capacitor.

DETAILED DESCRIPTION OF THE PREFERRED EMBODIMENTS

Figure 1:
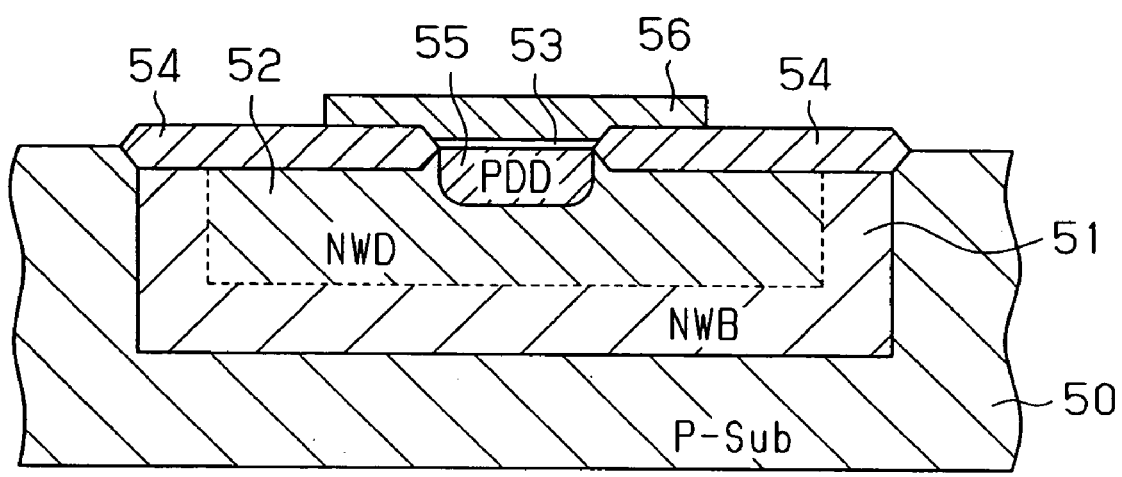
FIG. 1 is a cross-sectional view of a semiconductor device including a prior art capacitor.

A semiconductor device according to a first embodiment of the present invention will now be discussed with reference to FIGS. 2 and 3.

A first n-well 2 is formed in the surface of a p-type silicon substrate 1, which functions as a p-type semiconductor substrate. A second n-well 3 is superimposed and formed in the first n-well 2. A gate insulation film 4 is formed on the second n-well 3. A field insulation film 5 is formed adjacent to and surrounding the gate insulation film 4 on the second n-well 53. The field insulation film 5 is an oxide film formed by, for example, performing local oxidation of silicon (LOCOS). The gate insulation film 4 is thinner than the field insulation film 5. The periphery of the first n-well 2 and the periphery of the second n-well 3 are located under the field insulation film 5.

A gate electrode 8, which is a conductive body made of a material such as metal or polysilicon, is formed to contact the entire upper surface of the gate insulation film 4 and part of the upper surface of the field insulation film 5. A p+ type diffusion layer 6. (PDD layer) having a high p-type impurity concentration is formed in the surface of the second n-well 3. The upper surface of the p+ type diffusion layer 6 contacts the gate insulation film 4. The edge of the p+ type diffusion layer 6 is separated from an edge of the field insulation film 5 (i.e., the boundary between the gate insulation film 4 and the field insulation film 5), at which the electric field is concentrated. More specifically, the edge of the p+ type diffusion layer 6 is spaced from the edge of the field insulation film 5 under the gate insulation film 4.

Figure 3:
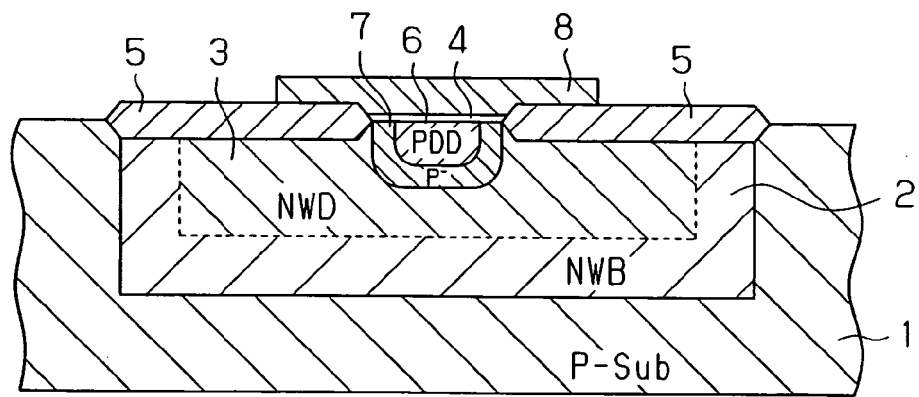
FIG. 3 is a cross-sectional view taken along line 3-3 in FIG. 2.

Referring to FIG. 3, when the field insulation film 5 is a LOCOS oxide film, the p-type diffusion layer 7 is separated from the end of the vertex ("bird's beak") formed in the LOCOS oxide film.

The gate electrode 8, the gate insulation film 4, and the p+ type diffusion layer 6 form a PDD capacitor. The gate electrode 8 and the p+ type diffusion layer 6 function as opposing electrodes. The gate insulation film 4 located between the gate electrode 8 and the p+ type diffusion layer 6 functions as a capacitor insulation film. The p-type impurity concentration of the p+ type diffusion layer 6 is increased to decreases the voltage dependency (e.g., gate voltage dependency) of the capacitor. The preferred p+ type impurity concentration of the p+ type diffusion layer 6 for reducing the voltage dependency is $1\times10^{18}/cm^3$ to $1\times10^{20}/cm^3$. The edge of the p+ type diffusion layer 6 is spaced from the edge of the field insulation film 5. This increases pn junction diode reverse breakdown voltage at the pn junction between the p+ diffusion layer 6 and the second n-well 3. A p-type diffusion layer 7, which has a relatively low impurity concentration, surrounds the p+ type diffusion layer 6, which has a relatively high impurity concentration, to increase the pn junction diode reverse breakdown voltage. Ion implantation is performed to form the p-type diffusion layer 7 in alignment with the edge of the field insulation film 5.

Figure 2:
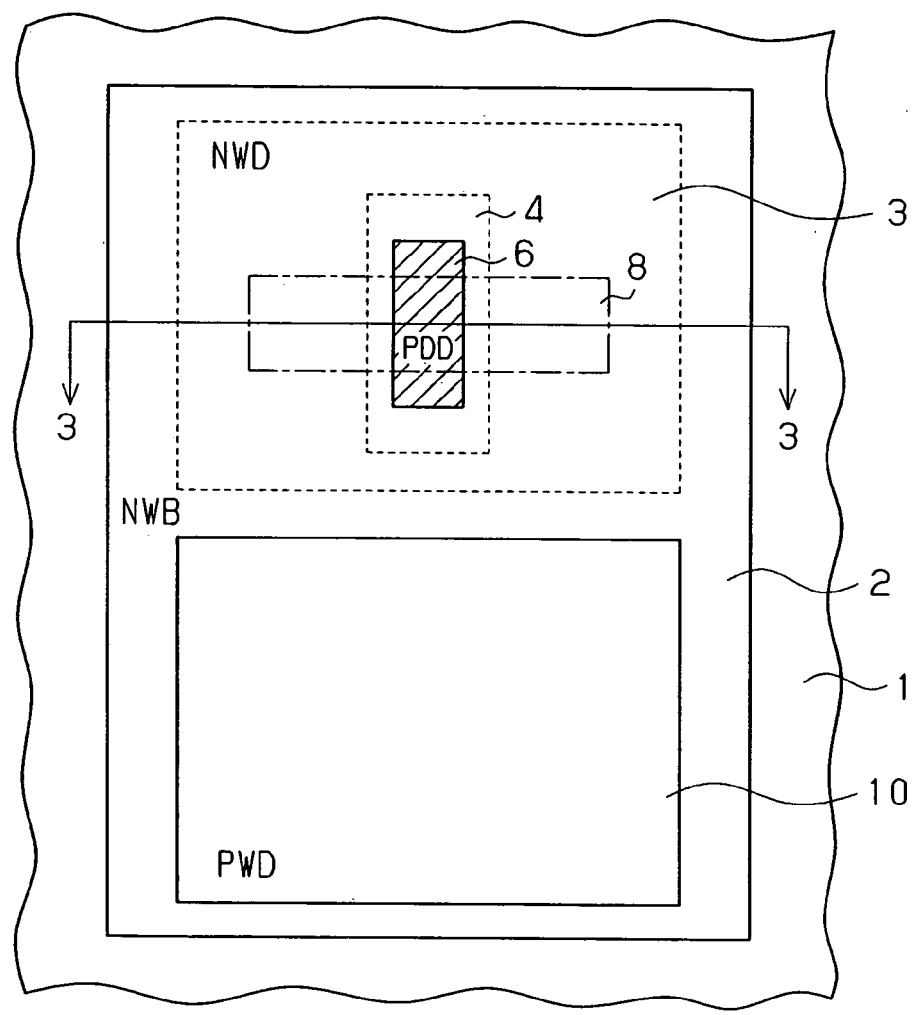
FIG. 2 is a plan view showing a semiconductor device according to a first embodiment of the present invention.

The semiconductor device of FIG. 2 has a triple well configuration in which a p-well 10 is formed adjacent to the second n-well 3 in the first n-well 2, which is formed in the p-type silicon substrate 1. The second n-well 3 is one of a plurality of second n-wells 3. A p-channel MOS transistor is arranged in each of the second n-wells 3. Further, an n-channel MOS transistor is arranged in the p-well 10.

An NDD capacitor may be formed by changing the polarities of the p-type silicon substrate 1, the first n-well 2, the second n-well 3, and the p-well 10 from p type to n type and changing the polarity of the p+ type diffusion layer to n+ type. In this case, it is preferred that the n-type impurity concentration be $5\times10^{18}/cm^3$ to $5\times10^{20}/cm^3$ to reduce voltage dependency.

A semiconductor device according to a second embodiment of the present invention will now be described with reference to FIGS. 4 and 5. The description will center on parts differing from the first embodiment. Parts that are like those of FIGS. 2 and 3 will be denoted with the same reference numerals.

In the semiconductor device of the first embodiment, the gate electrode 8 is opposed to the second n-well 3 and the p-type diffusion layer 7 between the p+ type diffusion layer 6 and the edge of the field insulation film 5. This structure slightly enlarges the gate voltage dependency of the capacitor. In the semiconductor device of the second embodiment, the gate voltage dependency of the capacitor is reduced and the pn junction diode reverse breakdown voltage of the capacitor is increased.

More specifically, a p-well 11 is formed in the first n-well 2. A p+ type diffusion layer 12 is formed on the surface of the p-well 11. The edge of the p+ diffusion layer 12 is arranged in alignment with an edge of the field insulation film 5 (oxide film). This configuration is formed by, for example, ion-implanting p-type impurities (e.g., boron or $BF_2$) in the surface of p-well 11 under the gate insulation film 4 using the field insulation film 5 as a mask. The gate electrode 8 is opposed to the p+ type diffusion layer 12 via the gate insulation film 4 since the p+ type diffusion layer 12 is arranged along the entire lower surface of the gate insulation film 4. The gate electrode 8 is not opposed to the p-well 11, the impurity concentration of which is lower than the p+ type diffusion layer 12. This configuration decreases the gate voltage dependency of the capacitor. Further, the pn junction of the capacitor is formed by the p-well 11, of which impurity concentration is low, and the first n-well 2. This increases the pn junction diode reverse breakdown voltage.

In the same manner as the first embodiment, the preferred p+ type impurity concentration of the p+ type diffusion layer 12 for reducing the voltage dependency is $1\times10^{18}/cm^3$ to $1\times10^{20}/cm^3$.

Figure 4:
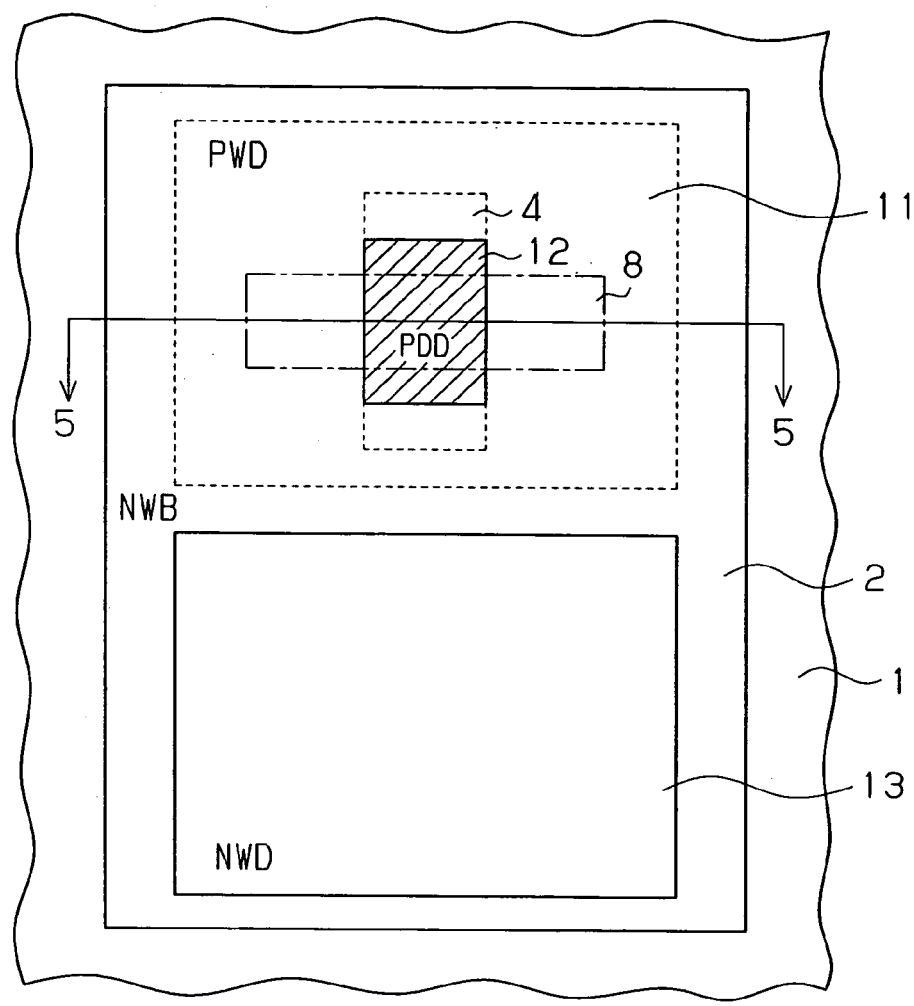
FIG. 4 is a plan view showing a semiconductor device according to a second embodiment of the present invention.
Figure 5:
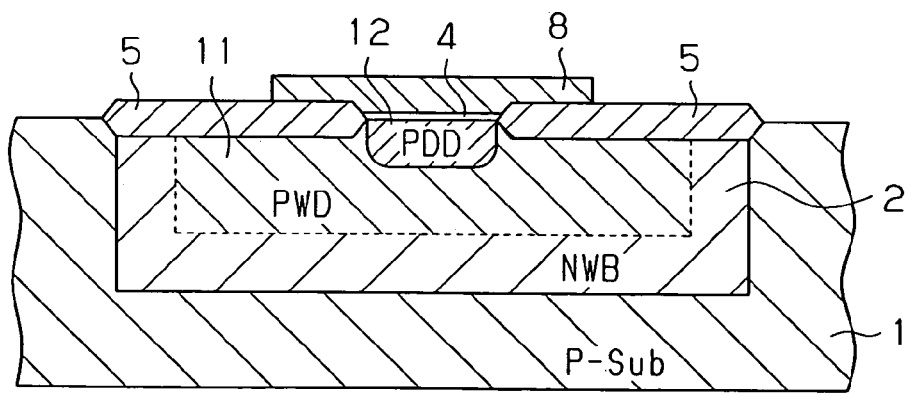
FIG. 5 is a cross-sectional view taken along line 5-5 in FIG. 4.

The semiconductor device of FIG. 4 has a triple well configuration in which a second n-well 13 is formed adjacent to the p-well 11 in the first n-well 2, which is formed in the p-type silicon substrate 1. A capacitor is configured in the p-well 11 in this manner. The p-well 11 is one of a plurality of p-wells 11. An n-channel MOS transistor is arranged in each of the p-wells 11. Further, a p-channel MOS transistor is arranged in the second n-well 13.

An NDD capacitor may be formed by changing the polarities of the p-type silicon substrate 1, the first n-well 2, the second n-well 13, and the p-well 11 from p type to n type and changing the polarity of the p+ type diffusion layer to n+ type. In this case, it is preferred that the n-type impurity concentration be $5\times10^{18}/cm^3$ to $5\times10^{20}/cm^3$ to reduce voltage dependency.

The graph of FIG. 6 shows the gate voltage dependency of the PDD capacitor in the semiconductor device according to the second embodiment of the present invention (refer to FIGS. 2 and 3) and of the PDD capacitor (refer to FIG. 1) of the prior art example. The second n-well in the second embodiment and the first n-well 51 in the prior art example are both in a floating state. It is apparent from FIG. 6 that the gate voltage dependency of the PDD capacitor in the second embodiment is small and substantially the same as in the prior art.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A capacitor comprising:
   a semiconductor substrate having a first type of conductivity and including a surface;
   a first well having a second type of conductivity and formed in the surface of the semiconductor substrate;
   a second well, having the second type of conductivity, formed in the first well and including a surface;
   a first diffusion layer, having the first type of conductivity and including an edge, formed on the surface of the second well;
   a second diffusion layer, formed in the second well, having the first type of conductivity and a concentration lower than that of the first diffusion layer and surrounding the first diffusion layer;

a capacitor insulation film formed on the first diffusion layer and the second diffusion layer;

a field insulation film surrounding the capacitor insulation film, the field insulation film including an edge adjacent to the capacitor insulation film, and the edge of the field insulation film being entirely spaced from the edge of the first diffusion layer; and an electrode formed on the capacitor insulation film and opposed to the first diffusion layer.

2. The capacitor according to claim 1, wherein the second diffusion layer includes an edge arranged in alignment with the edge of the field insulation film.

3. The capacitor according to claim 1 further comprising:

a third well having the first type of conductivity and arranged adjacent to the second well in the first well.

4. A capacitor comprising:

a semiconductor substrate having a first type of conductivity and including a surface;

a first well having a second type of conductivity and formed in the surface of the semiconductor substrate;

a second well, having the first type of conductivity, formed in the first well and including a surface;

a diffusion layer having the first type of conductivity and formed on the surface of the second well;

a capacitor insulation film formed on the diffusion layer;

a field insulation film formed adjacent to and surrounding the capacitor insulation film; and an electrode formed on the capacitor insulation film and opposed to the diffusion layer, wherein the capacitor insulation film includes an overlapped portion on which the electrode overlaps, and wherein the overlapped portion is entirely opposed to a portion of the diffusion layer.

5. The capacitor according to claim 4, wherein the field insulation film includes an edge adjacent to the capacitor insulation film, and the diffusion layer includes an edge arranged in alignment with the edge of the field insulation film.

6. The capacitor according to claim 4, further comprising:

a third well having the second type of conductivity and arranged adjacent to the second well in the first well.

7. The capacitor according to claim 4, wherein the overlapped portion is entirely opposed to and entirely contacts said portion of the diffusion layer.

* * * * *